United States Patent [19]

Soma et al.

[11] 3,952,834

[45] Apr. 27, 1976

[54] EMBEDDED TYPE SPEAKER WITH OVER LYING GRILL

[75] Inventors: Hiroshi Soma, Tokyo; Yutaka Tamura; Kenzo Miyazawa, both of Tokorozawa, all of Japan

[73] Assignee: Pioneer Electronic Corporation, Tokyo, Japan

[22] Filed: Oct. 18, 1974

[21] Appl. No.: 515,954

[30] Foreign Application Priority Data

Oct. 18, 1973 Japan ........................ 48-120848[U]
Oct. 18, 1973 Japan ........................ 48-120849[U]

[52] U.S. Cl. ................................. 181/150; 181/148
[51] Int. Cl.$^2$ ........................................ H05K 5/00
[58] Field of Search ........... 181/150, 149, 148, 156, 181/199, 155

[56] References Cited

UNITED STATES PATENTS 2,195,651 4/1940 Holliday .............................. 181/150
2,346,226 4/1944 Marlow ............................... 181/199
2,744,584 5/1956 Hellon ................................ 181/150
2,982,372 5/1961 Lowell ................................ 181/155

*Primary Examiner*—Stephen J. Tomsky
*Attorney, Agent, or Firm*—Sughrue, Rothwell, Mion, Zinn & Macpeak

[57] ABSTRACT

An embedded type speaker has the speaker body mounted on a wall by inserting the speaker within a mounting opening within the wall. A grill is detachably mounted in overlying fashion in front of the speaker body with the grill consisting of an annular grill frame having circumferentially spaced sound communicating holes at the peripheral portion and a large central opening therein. A support strip extends transversely across the central opening of the grill frame from one side of the frame to the other. A grill sheet overlies the grill frame to close off the central opening and has the same appearance and is preferably formed of the same material as that overlying the wall surface, facing in the same direction as the speaker. A packing is provided between the peripheral portion of the grill sheet and the periphery of the grill frame and a connecting member couples the center of the grill sheet to the center of the support strip.

6 Claims, 4 Drawing Figures

EMBEDDED TYPE SPEAKER WITH OVER LYING GRILL

BACKGROUND OF THE INVENTION

1. Field of the Invention

The present invention relates to an embedded type speaker mounted on wall or ceiling of a building or the inner surface of an automobile door or the like, and more particularly to such a speaker having a grill which provides a surface portion having the same appearance as the wall surface adjacent the grill.

2. Description of the Prior Art

As embedded type speaker is normally mounted by embedding it within a mounting opening formed by cutting out an opening of predetermined shape and size within a portion of a building or automotive interior structure material such as a wall surface which supports the speaker. The speaker is mounted by embedding it or inserting it within the mounting opening and mounting it to the wall or the surface covering the wall within which the mounting opening is formed. Preferably, a grill is provided on the speaker which overlies the speaker on the outside surface thereof. However, the design of grills for embedded type speakers presently on the market are standardized and do not harmonize with the material which decorates the interior of the automobile or building wall which supports the same. Further since the speakers are employed in different environments of use, the diversity of such use in recent years results in a deterioration in the decorative atmosphere as a whole by the presence of the nonharmonious grill for the embedded type speakers.

It is therefore an object of the present invention to provide an embedded type speaker whose grill construction does not adversely effect the decorative nature of the embedded type speaker and which permits the speaker grill to incorporate decorative material which may be identical to that covering the surface of the wall to which the speaker and grill are mounted, or any type decorative material which may pleasantly contrast therewith.

SUMMARY OF THE INVENTION

The invention resides in an improvement in an embedded type speaker which includes a speaker body mounted within an opening formed within a supporting wall and wherein a grill is detachably mounted in front of the speaker body. The grill consists of an annular grill frame having circumferentially spaced sound communicating holes within a peripheral portion thereof, a central opening within the grill frame, and a transverse supporting member extending through the central opening from one side of the grill frame to the other. A circular grill sheet, preferably of a material having the same appearance as the material of the surface of the wall supporting the speaker and grill, closes off the central opening of the grill frame and is fixed to the grill frame at its periphery with packing material provided between the peripheral portion of the grill sheet and the grill frame, and a connecting member mounts the center of the grill sheet to the supporting member which transversely extends across the central opening of the grill frame.

An auxiliary plate underlies the grill sheet 10, and the plate and the grill sheet are pressed against the grill frame at the periphery by the transverse supporting member and are fixed at the center to the supporting member by the mounting member.

DESCRIPTION OF THE PREFERRED EMBODIMENT

Figure 1:
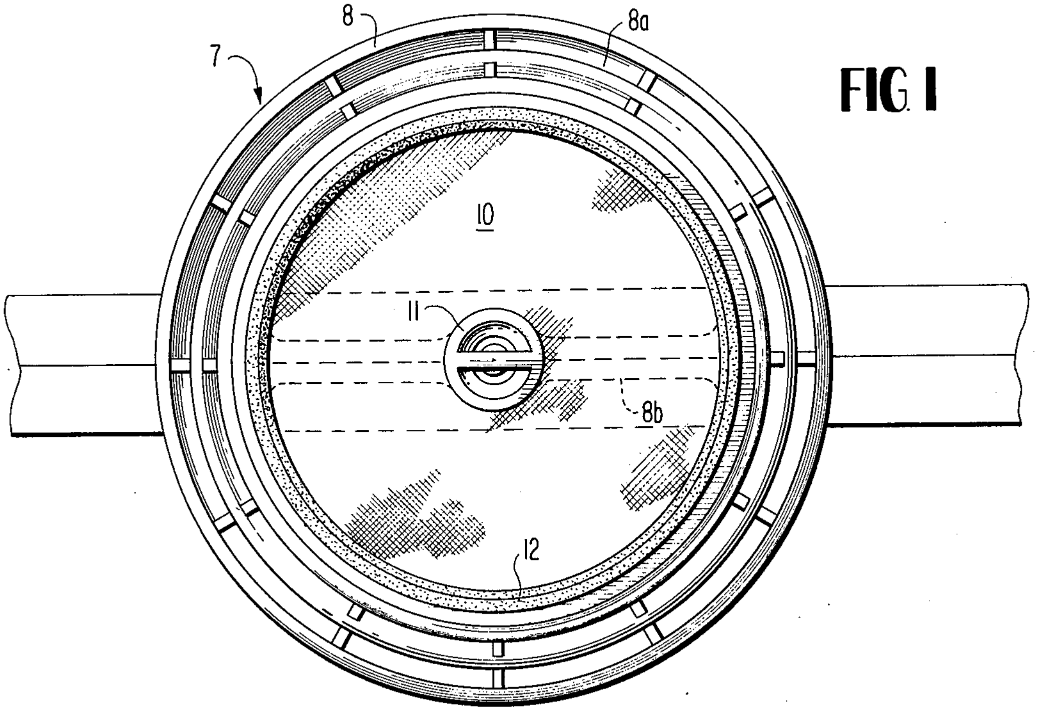
FIG. 1 is a front view of the embedded type speaker constituting one embodiment of the present invention.
Figure 2:
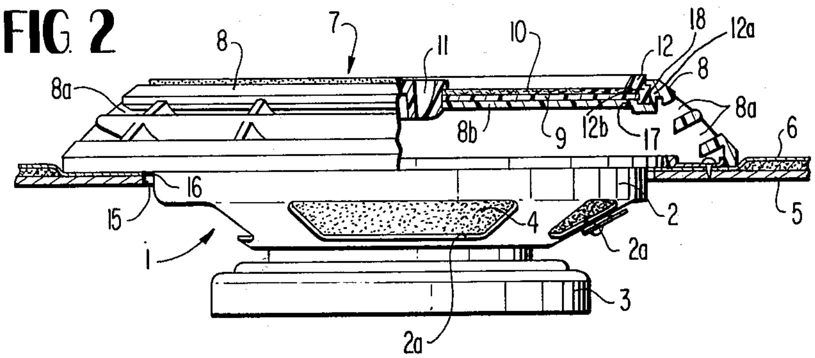
FIG. 2 is a longitudinal side view of the embedded type speaker of FIG. 1, partially in section.

Reference to FIGS. 1 and 2 show one embodiment of the present invention, wherein an embedded type speaker takes the form of a speaker body 1 which comprises a frame 2 and a magnetic circuit 3, the frame 2 being in the form of a cone and provided with a conical vibrating plate 4 located within the frame 2 viewed through opening 2*a*. The speaker body 1 is insertably mounted within a mounting opening 15 cut within wall 5, the wall 5 being provided with a decorative structural material 6 which is also cut out as at 16 to form a circular opening conforming to that of opening 15 within wall 5. The speaker body 1 is mounted in a predetermined position by fixing the frame 2 on the wall member 5 by means of fixing screws or the like.

Further, a grill 7 is detachably mounted to the frame 2 by means (not shown). The grill 7 comprises an annular grill frame 8 formed with a plurality of circumferentially spaced sound communicating holes 8*a* about the periphery of the same. A large central opening 17 of the annular grill frame 8 is closed off by an auxiliary plate 9 which is detachably mounted on the grill frame 8 and which carries an overlying grill sheet 10. The auxiliary plate 9 and the grill sheet 10 are press mounted to the grill frame 8 from the rear side by a supporting portion or member 8*b* of the grill frame 8, preferably integral therewith, the supporting portion or member 8*b* taking the form of a transverse strip which traverses laterally across the central opening 17 the grill frame 8 and underlies the auxiliary plate 9 and grill sheet 10. The auxiliary plate 9 and the grill sheet 10 are fixed in this embodiment to the supporting portion 8*b* by a buttonshaped mounting member 11 which frictionally fits into openings formed within grill sheet 10, auxiliary plate 9, and the supporting portion 8*b* of the grill frame 8. In order to prevent a gap from being created between the outer peripheral edges of the auxiliary plate 9 and the grill sheet 10, both of which are circular in form, and the grill frame 8 and to prevent the auxiliary plate 9 from vibrating by resonance caused by vibration of the vibrating plate 4 of the speaker, an annular packing 12 made of an elastic material such as rubber grips the periphery of the auxiliary plate 9 and the grill sheet 10 and in turn is gripped by the peripheral portion of the annular grill frame 8. In this regard, the inner peripheral edge of the annular grill frame 8 includes an annular recess 18, the annular elastic packing 12 includes a correspondingly sized and configured annular projection 12*a* on its outer periphery which is pressed into recess 18. Further, the inner periphery of the packing 12 carries a stepped annular recess 12*b* which receives and elastically presses the outer peripheral edges of auxiliary plate 9 and grill sheet 10 onto the grill frame 8 to prevent vibration of the plate 9 and grill sheet 10 during speaker operation.

The grill sheet 10 is formed by cutting a portion of the interior decorative material 6 in circular form conforming to the opening within the annular grill and having dimensions the same as that of auxiliary plate 9. Accordingly, the part of the wall surface or the like upon which the embedded type speaker is mounted, thus further supports a grill sheet 10 having the same color and design as the other portion of the interior wall surface except the small area occupied by the annular portion of grill frame 8 as shown in Figure. As a result, in contrast to the case where the conventional embedded type speaker is entirely in contrast to that of the wall, in the present invention there is no chance of disturbing the visual harmony of the wall surface. Further, the connecting member 11 serves to perform the function of concealing the small hole which is formed as the rotating center of a compass-like tool used in circular cutting of the interior structural material 6 covering the wall surface in completing the mounting of the grill to the wall surface and overlying the embedded type speaker.

Figure 3:
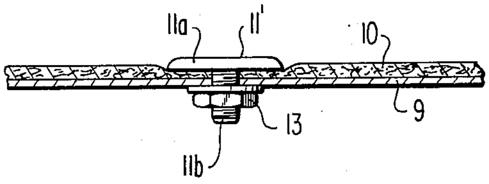
FIG. 3 is an enlarged, sectional view of a modified form of the present invention.
Figure 4:
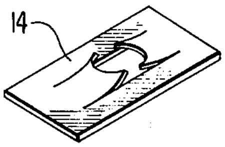
FIG. 4 is a perspective view of a speed nut to be alternatively employed as part of the connecting member illustrated in FIG. 3.

Reference to FIGS. 3 and 4 illustrate the use of a mounting member 11' comprising a modified bolt and nut connection including a head portion 11*a* and a threaded portion 11*b*, the arrangement being such in FIG. 3 that the grill sheet 10 and the auxiliary plate 9 are clamped between the head portion 11*a* and a conventional hex nut 13 screwed onto the threaded portion 11*b*. Reference to FIG. 4 shows a conventional type sheet metal speed nut 14 which may be substituted for the hex nut 13 as shown in FIG. 3.

While the invention has been described in conjunction with an embedded type speaker in which the grill is detachably mounted to the speaker body, the grill may be completely separate from the speaker and may be independently mounted to the wall which receives the speaker.

while the invention has been particularly shown and described with reference to a preferred embodiment thereof, it will be understood by those skilled in the art that various changes in form and details may be made therein without departing from the spirit and scope of the invention.

What is claimed is:

1. In an embedded type speaker of the type wherein a speaker body is mounted within a opening formed within a wall and a grill is mounted in front of the speaker body and overlying the opening and the speaker body, the improvement comprising: said grill consisting of an annular grill frame having circumferentially spaced sound communicating holes within a peripheral portion thereof, said peripheral portion defining a central opening, said grill including a supporting portion extending transversely across said grill frame central opening from one side to the other and at least a circular grill sheet spanning said opening in front of said supporting portion to close off the central opening of the grill frame, and having an external surface appearance compatible with the exterior surface of the wall supporting the speaker body and the grill, means for mounting said grill sheet to the peripheral portion of the annular grill frame, said means for mounting said grill sheet to said annular grill frame comprises an annular elastic packing interposed between the inner periphery of said annular grill frame and the outer periphery of said circular grill sheet and means including said annular packing for pressing the peripheral edge of said circular grill sheet against said annular grill frame to prevent vibration therebetween, and a mounting member for connecting the center of the grill sheet to said supporting portion.

2. The embedded type speaker as claimed in claim 1, wherein a circular auxiliary plate underlies the grill sheet 10, is of the same dimensions with respect thereto, and is press mounted to the grill frame by said grill frame supporting portion.

3. The embedded type speaker as claimed in claim 1, wherein said mounting member comprises a nut and bolt, with said bolt extending through openings formed within said grill sheet and said supporting portion, with a head portion pressing said grill sheet against said supporting portion and nut threadably coupled to said bolt on the side of said supporting portion facing said speaker body.

4. The embedded type speaker as claimed in claim 2, wherein said mounting member comprises a nut and bolt, with said bolt extending through openings formed within said grill sheet and said supporting portion, with a head portion pressing said grill sheet against said supporting portion and a nut threadably coupled to said bolt on the side of said supporting portion facing said speaker body.

5. The embedded type speaker as claimed in claim 3, wherein said nut comprises a sheet metal speed nut.

6. The embedded type speaker as claimed in claim 1, wherein said annular grill frame includes an annular recess within its inner periphery and said annular packing includes an annular projection on its outer periphery elastically received within said grill frame annular recess, and wherein said annular packing further includes an annular recess within its inner periphery which receives the outer peripheral edge of said circular grill sheet to press said circular grill sheet against said annular grill frame.

* * * * *